United States Patent [19]

Hein et al.

[11] Patent Number: 5,496,658
[45] Date of Patent: Mar. 5, 1996

[54] STORAGE BATTERY STATE-OF-CHARGE INDICATOR

[75] Inventors: Edward R. Hein, Mohnton; Gerald D. Hudack, Sinking Spring; John F. Bear, Mohrsville; Scott J. Cronrath, Shillington, all of Pa.

[73] Assignee: Exide Corporation, Reading, Pa.

[21] Appl. No.: 279,798

[22] Filed: Jul. 25, 1994

[51] Int. Cl.⁶ .......................... H01M 10/48; H01M 2/00; H02J 7/04; G08B 21/00
[52] U.S. Cl. .................. 429/93; 429/90; 429/91; 429/92; 429/61; 429/163; 429/174; 429/175; 429/177; 320/30; 320/43; 340/500; 340/501; 340/514; 340/540; 340/635; 340/636; 116/202
[58] Field of Search ................. 429/61, 90, 91, 429/92, 163, 175, 176, 177, 174; 320/30, 43; 340/500, 501, 514, 540, 635, 636; 116/202

[56] References Cited

U.S. PATENT DOCUMENTS

| | | | |
|---|---|---|---|
| 964,995 | 7/1910 | Marko | 324/429 |
| 1,553,742 | 9/1925 | Blatter | 429/93 |
| 1,567,376 | 12/1925 | McIntyre et al. | 340/636 |
| 1,597,614 | 8/1926 | Nelson | 340/636 |
| 2,286,101 | 6/1942 | Norberg et al. | 340/636 |
| 3,061,827 | 10/1962 | Fiandt et al. | 340/249 |
| 3,181,975 | 5/1965 | Albrecht | 136/181 |
| 3,460,995 | 8/1969 | Webb | 340/636 |
| 3,508,973 | 4/1970 | Hicks et al. | 340/636 |
| 4,061,839 | 12/1977 | Köhler | 429/93 |
| 4,248,942 | 2/1981 | Eby et al. | 429/93 |
| 4,289,836 | 9/1981 | Lemelson | 429/61 |
| 4,308,817 | 1/1982 | Peterson | 429/90 |
| 4,365,241 | 12/1982 | Morishita | 320/43 |
| 4,625,175 | 11/1986 | Smith | 324/430 |
| 4,910,103 | 3/1990 | Yoshikawa et al. | 429/92 |
| 4,943,777 | 7/1990 | Nakamura et al. | 324/429 |
| 5,099,210 | 3/1992 | Fortney et al. | 324/433 |
| 5,130,659 | 7/1992 | Sloan | 324/435 |
| 5,159,272 | 10/1992 | Rao et al. | 324/429 |
| 5,216,371 | 6/1993 | Nagai | 429/90 |

OTHER PUBLICATIONS

National Semiconductor Corporation—LM3914 Dot/Bar Display Driver, pp. 1–16, May 1989.
Motorola Semiconductor Technical Data—LM124, LM224, LM324, LM324A, LM2902, pp. 2-60–2-65 (undated) month and year unavailable.
RCA Specification Sheets for COS/MOS AND Gates, CD4073B, CD4081B, CD4082B Types, pp. 223–226 (undated) month and year unavailable.

Primary Examiner—Bruce F. Bell
Attorney, Agent, or Firm—Nixon & Vanderhye

[57] ABSTRACT

A storage battery is provided which includes a casing and a cover secured to the casing. The cover includes a body having a top surface and a peripheral skirt; the top surface having a plurality of vent apertures, at least one negative terminal and at least one positive terminal, and an elongated recess having a bottom, four side walls and an open top. The negative and positive terminals have extensions exposed at opposite ends of the recess, and a state-of-charge indicator assembly is mounted in the recess and electrically connected to the negative and positive terminal extensions. The state-of-charge indicator assembly is sealed in the recess by relatively thin adhesive seal or membrane applied over the open top and adhered to the top surface of the cover. The membrane is provided with percent charge and test switch indicia thereon.

20 Claims, 7 Drawing Sheets

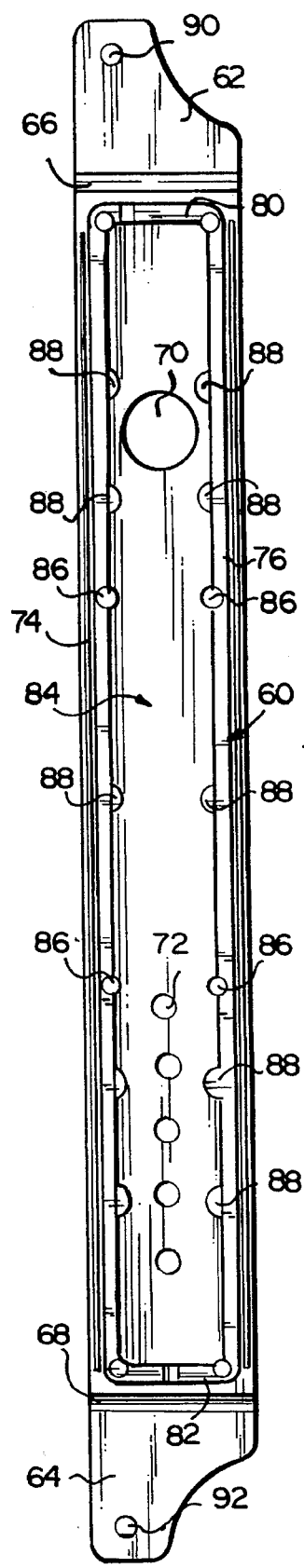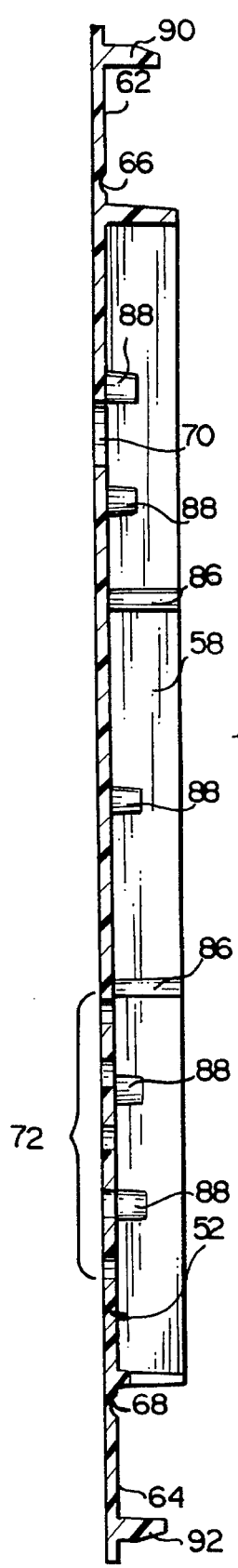
Fig. 6
Fig. 7

5,496,658

STORAGE BATTERY STATE-OF-CHARGE INDICATOR

TECHNICAL FIELD

This invention relates to lead acid storage batteries in general, and to a unique battery cover design incorporating a state-of-charge indicator in particular.

BACKGROUND

There have been numerous attempts in the past to provide state-of-charge or battery condition indicators which allow users to readily determine the state-of-charge of storage batteries, particularly those used in automobiles. These attempts have ranged from the extremely simple to very sophisticated, and representative examples found in the patent literature include the following U.S. Pat. Nos. 964,995; 3,061,827; 3,408,973; 4,289,836; 4,625,175; 5,130,659; and 5,159,272.

There remains a need, however, for a low cost, reliable state-of-charge indicator which is both easy to use and easy to manufacture. It is the principal object of this invention, therefore, to provide an easy to use and reliable state-of-charge indicator which, in the exemplary embodiment, is incorporated directly within the cover of a lead acid battery of the types used in automotive and marine applications.

DISCLOSURE OF THE INVENTION

In accordance with an exemplary and preferred embodiment of the invention, a state-of-charge indicator assembly is mounted within a recess formed in an exterior surface of the battery cover and sealed with respect to the cover by means of a relatively thin adhesive film. In the exemplary embodiment, the state-of-charge indicator assembly includes a plastic housing mounting an LED display board which includes a push button switch and five LED display lights. In addition, two microprocessor chips are mounted on the board which, in combination with a diode and a series of resistors, determines the state-of-charge of the battery in terms of percent charge. More specifically, the state-of-charge indicator will display state-of-charge at 0%, 25%, 50%, 75% and 100% readings. Terminal leads extending from opposite ends of the LED control board are soldered to battery terminal extensions and the entire assembly is sealed within the battery cover recess through the use of a relatively thin adhesive film. This film incorporates a substantially transparent window which overlies the LED display lights, and also includes a printed "button" overlying the indicator activation switch. In this way, the film in effect creates a sealed membrane switch and also seals the LED display lights so that no dirt, debris, acid or other liquid can seep into the indicator in the area of the switch button, or even into the recess generally which supports the state-of-charge indicator assembly.

The state-of-charge indicator assembly is shown and described here in the context of a dual terminal battery cover. It will be appreciated, however, that the state-of-charge battery indicator of this invention is equally applicable to other terminal configurations including so-called "universal" terminals, single terminal arrangements, side terminal arrangements, etc. In addition, the state-of-charge indicator of this invention is equally applicable to (but not limited to) storage batteries designed for automotive as well as marine use.

It will be appreciated that the construction described herein is also applicable for indicators other than "state-of-charge", i.e., other battery conditions.

In its broadest aspects, the invention relates to a battery cover having an elongated recess therein, the recess having an open upper end; a battery condition indicator assembly mounted in the elongated recess and including a button switch actuator; and a relatively thin adhesive seal covering the recess and adhered to the cover, such that the button switch is accessible by applying force through the film.

In another aspect, therefore, the invention relates to a battery cover including a body having a plurality of vent apertures, at least one negative terminal and at least one positive terminal, the improvement comprising a recess in the cover opening to a top surface thereof; a battery condition indicator assembly including secured within the recess, and a relatively thin seal adhered to the cover overlying the recess and sealing the indicator assembly therein, the indicator assembly adapted for activation through the film, and with the display light visible through the film.

In another aspect, the invention relates to a battery cover including a body having a top surface and a peripheral skirt; the top surface having a plurality of vent apertures, at least one negative terminal and at least one positive terminal, and an elongated recess having a bottom, four side walls and an open top; the negative and positive terminals having extensions exposed at opposite ends of the recess; a state-of-charge indicator assembly mounted in the recess and electrically connected to the negative and positive terminals; the state-of-charge indicator assembly being sealed in the recess by a membrane applied over the open top and adhered to the top surface, the membrane having percent charge and test switch indicia thereon, and wherein the state-of-charge indicator is activated by pressure applied through the film.

In still another aspect, the invention relates to a storage battery including a casing and a cover secured to the casing, the cover including a body having a top surface and a peripheral skirt; the top surface having a plurality of vent apertures, at least one negative terminal and at least one positive terminal, and an elongated recess having a bottom, four side walls and an open top; the negative and positive terminals having extensions exposed at opposite ends of the recess; a battery condition indicator assembly mounted in the recess and electrically connected to the negative and positive terminals; the battery condition indicator assembly sealed in the recess by a membrane applied over the open top and adhered to the top surface, wherein the battery condition indicator is activated by pressure applied through the membrane.

Additional objects and advantages of the invention will become apparent from the detailed description which follows.

BRIEF DESCRIPTION OF THE DRAWINGS

FIG. 6 is a bottom plan view of the state-of-charge indicator housing shown in FIG. 5;

FIG. 7 is a section view taken along the line 8—8 in FIG. 6;

DETAILED DESCRIPTION OF THE DRAWINGS

Figure 1:
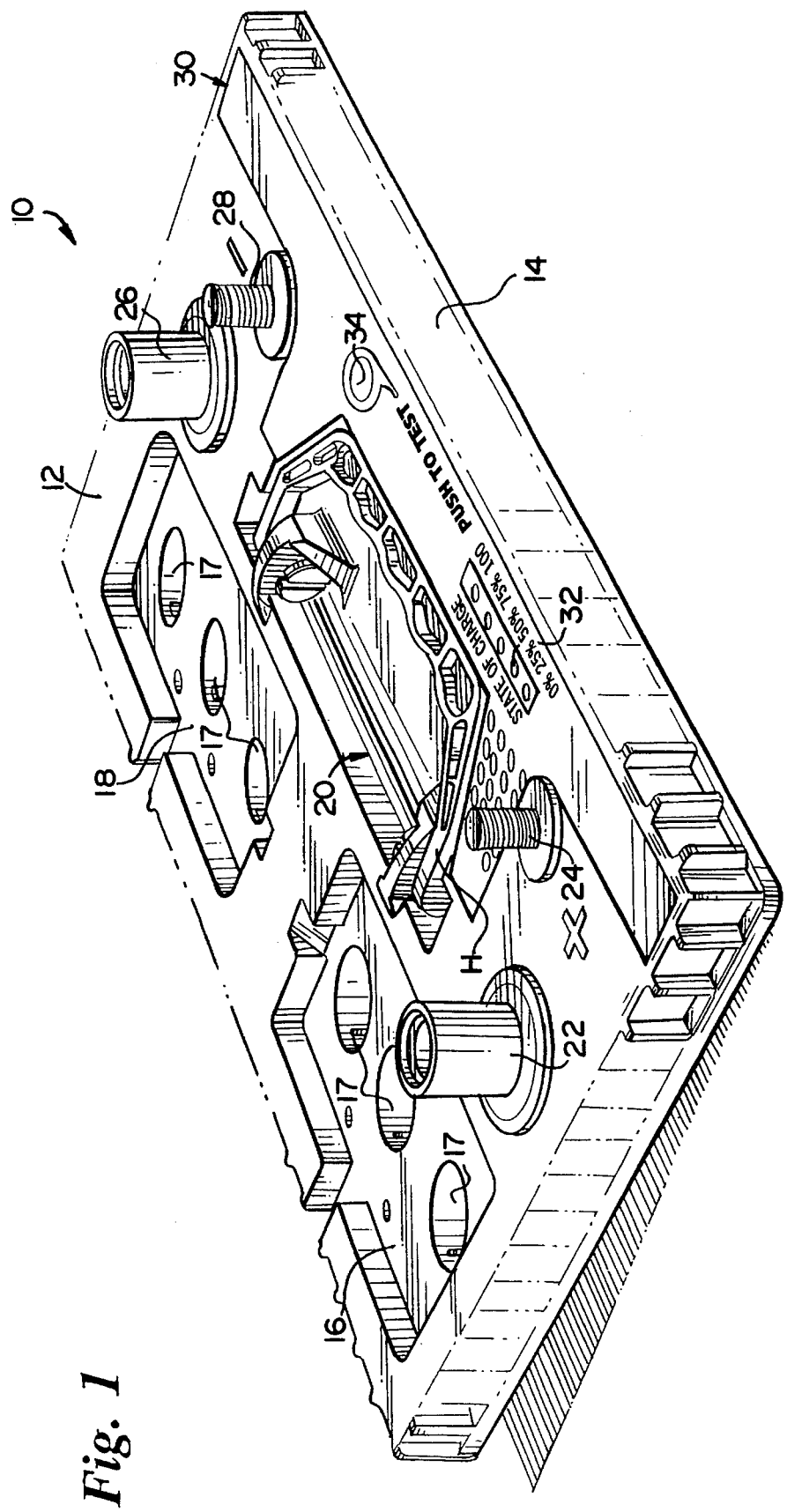
FIG. 1 is a perspective view of a battery cover in accordance with this invention.

With reference now to FIG. 1, a dual terminal battery cover 10 is shown which includes a molded body (typically of polypropylene) including a top surface 12 and a peripheral skirt 14. The top surface 12 is provided with a pair of vent cap recesses 16, 18, and a handle receiving recess 20. A handle H is pivotally secured within the recess 20; and is movable between a horizontal non-operative position, to a vertical operative position enabling the battery to be lifted for ease of installation, carrying, etc. The battery cover 10 also includes dual positive terminals 22, 24 and dual negative terminals 26, 28. Terminals 22 and 26 are clamp-type terminals while terminals 24, 28 are screw thread terminals. As described to this point, the cover 10 is of conventional construction.

A relatively thin state-of-charge indicator seal or plaque 30 is shown adhered to the upper surface 12 of the cover 10, and this seal 30 includes a transparent state-of-charge window 32 which permits underlying LED display lights to be seen, and a push-to-test area 34 overlying a switch or button, both of which are described in greater detail hereinbelow.

Figure 2:
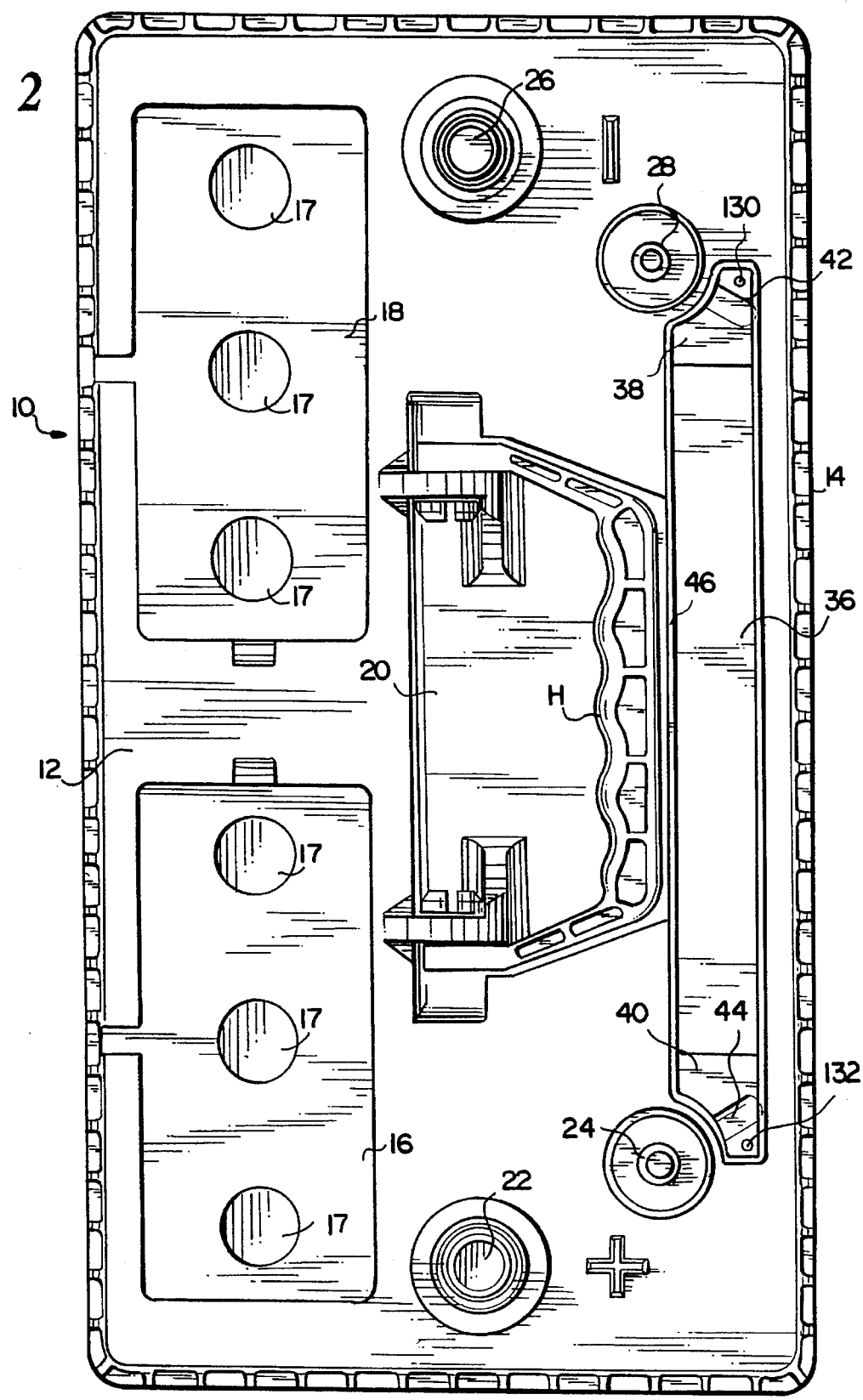
FIG. 2 is a plan view of the cover shown in FIG. 1, but with the state-of-charge indicator removed.
Figure 3:
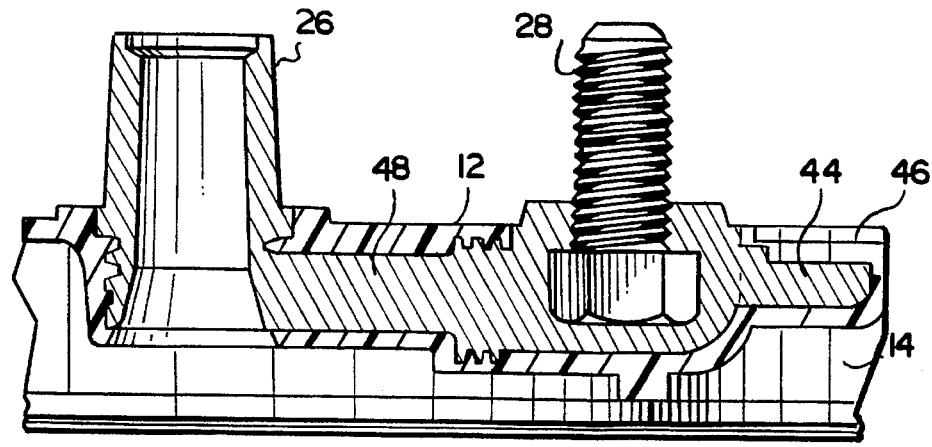
FIG. 3 is a side section taken along the line 3—3 of FIG. 2.
Figure 4:
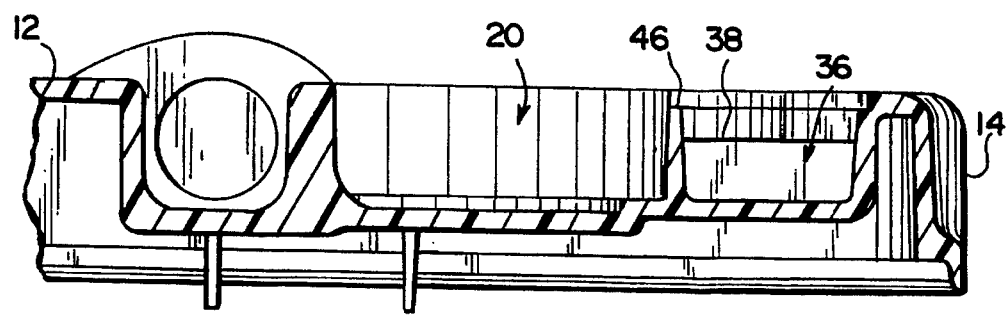
FIG. 4 is a side section taken along the line 4—4 of FIG. 2 but with the carrying handle removed for clarity.

With reference now to FIG. 2, the cover body 12 is shown in plan but with the state-of-charge seal or plaque 30 as well as the state-of-charge indicator device removed, i.e., the cover is shown as initially manufactured, with the terminals 22, 24, 26 and 28 molded in place within the cover. An elongated recess 36 is formed in the upper surface 12 of the cover body, located forward of the handle H and extending along the forward edge of the battery cover generally between the screw thread terminals 24, 28. Within this recess 36, there are raised, flat surface portions 38 and 40 at opposite ends of the recess 36 (see also FIG. 4). Within these raised or stepped surface portions, terminal extensions 42, 44 are exposed. In this regard, FIG. 3 illustrates the manner in which the pair of negative terminals 26, 28 are integrally connected via a lead strip 48 of which extension 44 forms a part. An identical arrangement is provided at the opposite end of the cover for positive terminals 22, 24 and extension 42.

A horizontal lip or shelf 46 extends about the entire periphery of the recess 36 and provides a seating surface for the state-of-charge indicator cartridge as explained below.

Figure 5:
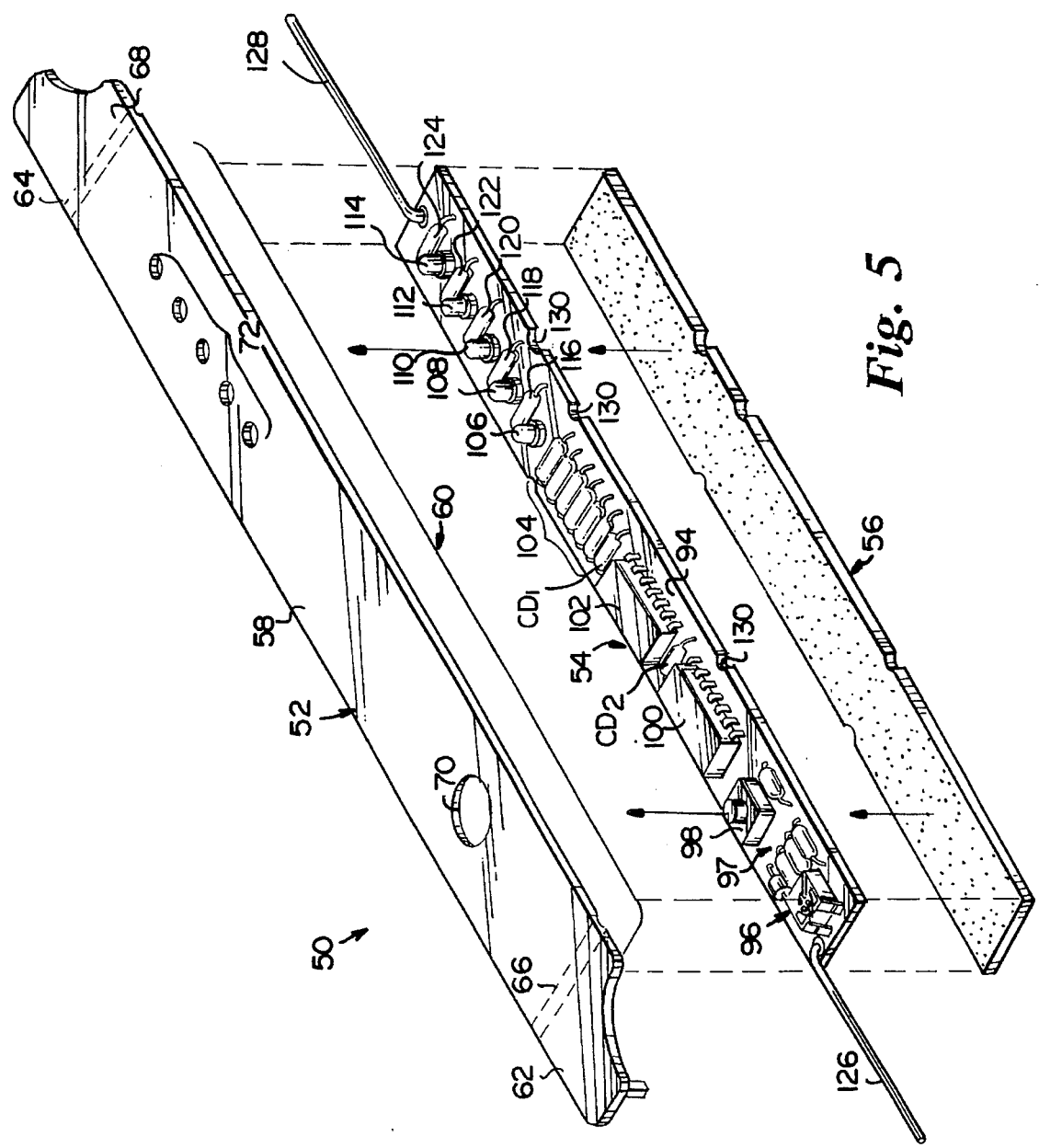
FIG. 5 is an exploded perspective of a state-of-charge indicator assembly in accordance with this invention.

With reference now to FIG. 5, the state-of-charge indicator assembly 50 is comprised essentially of three component parts. First, an assembly housing or cartridge 52 is adapted to receive the state-of-charge indicator LED board assembly 54 which, in turn, is sealed within the housing 52 by means of an EVA hot melt composition 56 which is shown in FIG. 5 as a solid sheet but, which in reality, is poured into place and solidified to sheet form in a conventional manner.

The housing or cartridge 52 includes a planar top surface 58 and a peripheral side wall or skirt 60 arranged in rectangular form, and adapted for relatively close fit within the recess 36 as described in greater detail below. The top surface 58 incorporates extended flap portions 62 and 64 at opposite ends thereof, and hinged thereto by means of thinned integral hinge lines 66, 68, respectively. The planar top surface 58 is also formed with a switch aperture 70 and a series (five in the exemplary embodiment) of LED apertures 72.

A bottom plan view of the housing or cartridge 52 is shown in FIG. 6, with peripheral skirt 60 formed of elongated parallel walls 74, 76 and shortened parallel end walls 80, 82. These four walls define an essentially rectangular recess or opening 84 which is adapted to receive the LED board assembly 54 in a manner more clearly described below.

Within the interior of the recess 84, and spaced about the interior periphery of the peripheral walls 74, 76, 80 and 82, there are a plurality of integral, vertically extending pairs of stops 86 which serve as insert depth stops for the LED board display 54. In addition, the walls 74 and 76 are also provided with two pair of vertically extending ribs 88 which serve as LED board locators or guides. The stops 86 extend approximately half the height of the recess 84 (or wall 60) and are adapted to be engaged by the upper surface of board 54 as viewed in FIG. 5. The ribs 88 extend the full height of the recess 84 (or wall 60) and merely assist in the locating of the board as explained further herein. The specific arrangement of stops 86 and guides 88 may vary as desired.

Turning again to FIG. 5, the LED board assembly 54 includes a substantially flat circuit board 94 supporting generally a Zener diode 96 and associated resistors 97; a button switch 98; two microprocessor chips 100, 102; power supply capacitors $CD_1$ and $CD_2$; a series of resistors 104; and five LED display lights 106, 108, 110, 112 and 114 (LCD's may also be used). The LED's may be colored in accordance with the following scheme: LED's 106 and 108 green, signifying 100% and 75% charge, respectively; LED 110 yellow, signifying 50% charge; LED 112 orange, signifying. 25% charge; and LED 114 red, signifying 0% charge.

The first chip 100 may be a quad low power operational amplifier, Model No. LM324A available from Motorola. The second chip 102 may be an AND Gate, Model No. CD4081B available from RCA. Alternatively, a single chip which incorporates the features of the two above identified chips, such as the National Semiconductor LM 34214 Dot/Bar Display Driver may be utilized.

Each display light has its own respective resistor 116, 118, 120, 122 and 124. Terminal connecting leads or wires 126 and 128 extend outwardly from opposite ends of the board assembly. The LED board assembly 54 is inserted within the rectangular recess 84 of the assembly housing 52 in the manner shown in FIG. 5, such that the board 54 abuts the half height stops 86. At the same time, the full height locators 88 are received within recesses 130 formed in the side edges of the board 94 as best seen in FIG. 5. Once the LED board assembly 54 is in place within the recess 84, a settable hot melt adhesive is applied to the assembly housing 52 to seal the LED board assembly 54 within the housing and, after curing, the EVA hot melt takes the form of sheet 56 as illustrated in FIG. 5.

From FIG. 5, it will be appreciated that, when the indicator is fully assembled, the LED display lights 106, 108, 110, 112 and 114 project into the apertures 72 in the upper planar surface 58 of the assembly housing 52. At the same time, the button switch 98 projects into and through the aperture 70.

The state-of-charge indicator assembly is inserted within the cavity 36 in the cover 10 with the epoxy layer 56 facing the floor of the recess and with the button switch and LED display lights visible from the top surface of the cover. It will be appreciated that the flap portions 62 and 64 overly the raised regions 38, 40 within the recess 36 and that the wire leads 126 and 128 are engageable with the terminal extensions 42, 44. By forming the flap portions 62, 64 as hinged extensions, the flaps 62, 64 may be manually raised so that the terminal leads 126, 128 can be soldered to the terminal extensions 42, 44. Following the soldering operation, the flap portions are pushed downwardly to a horizontal position, i.e., planar with the remaining top surface 58 with pegs 90 and 92 received in holes 130 and 132 (FIGS. 2 and 5–7)

The entire unit 50, including flap portions 62, 64, its then ultrasonically bonded to the battery cover along the peripheral shoulder or step 46 which extends about the recess 36 and about the lower edge of the base 60 which lies in abutting relationship with the floor of the recess 36. When fully inserted and bonded to the cover, the state-of-charge indicator assembly 50, and specifically the top surface 58, is substantially co-planar with the top surface 12 of the cover.

Figure 8:
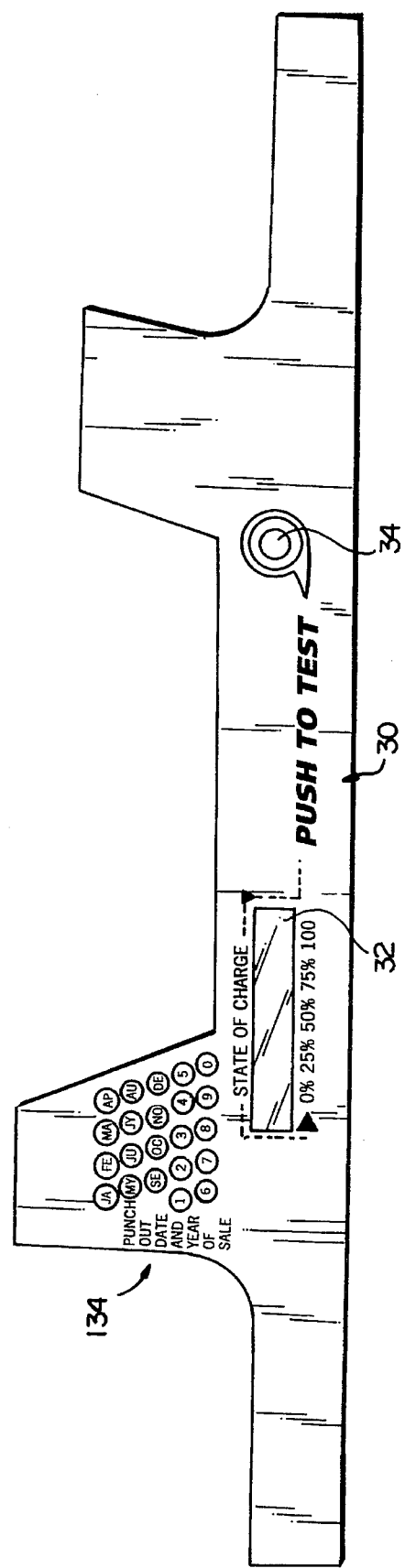
FIG. 8 is a plan view of a thin film seal in accordance with the invention.

Turning now to FIG. 8, the adhesive seal or plaque 30 is adapted for sealing engagement with the cover 10 and is shaped to overly the state-of-charge indicator assembly 50 and to seal the same against entry of dirt, debris, acid and the like from above. This plastic film 30 may be provided with a releasable backing sheet which can be removed prior to attachment of the film 30 to the battery cover 10. The transparent rectangle or window 32 directly overlies the five LED lights 106–114 so that the latter are visible through the plastic film 30. Beneath the window 32, % charge indicia are provided in alignment with the corresponding LED's, as explained above. The printed button 34 overlies the button switch 98, thereby essentially making the switch a diaphragm or membrane switch, activated by applying pressure on the switch 98 through the printed button 34. The film or plaque 30 also serves as a label with manufacturer name and other information provided as desired (e.g., see reference numeral 134 in FIG. 8).

Figure 9:
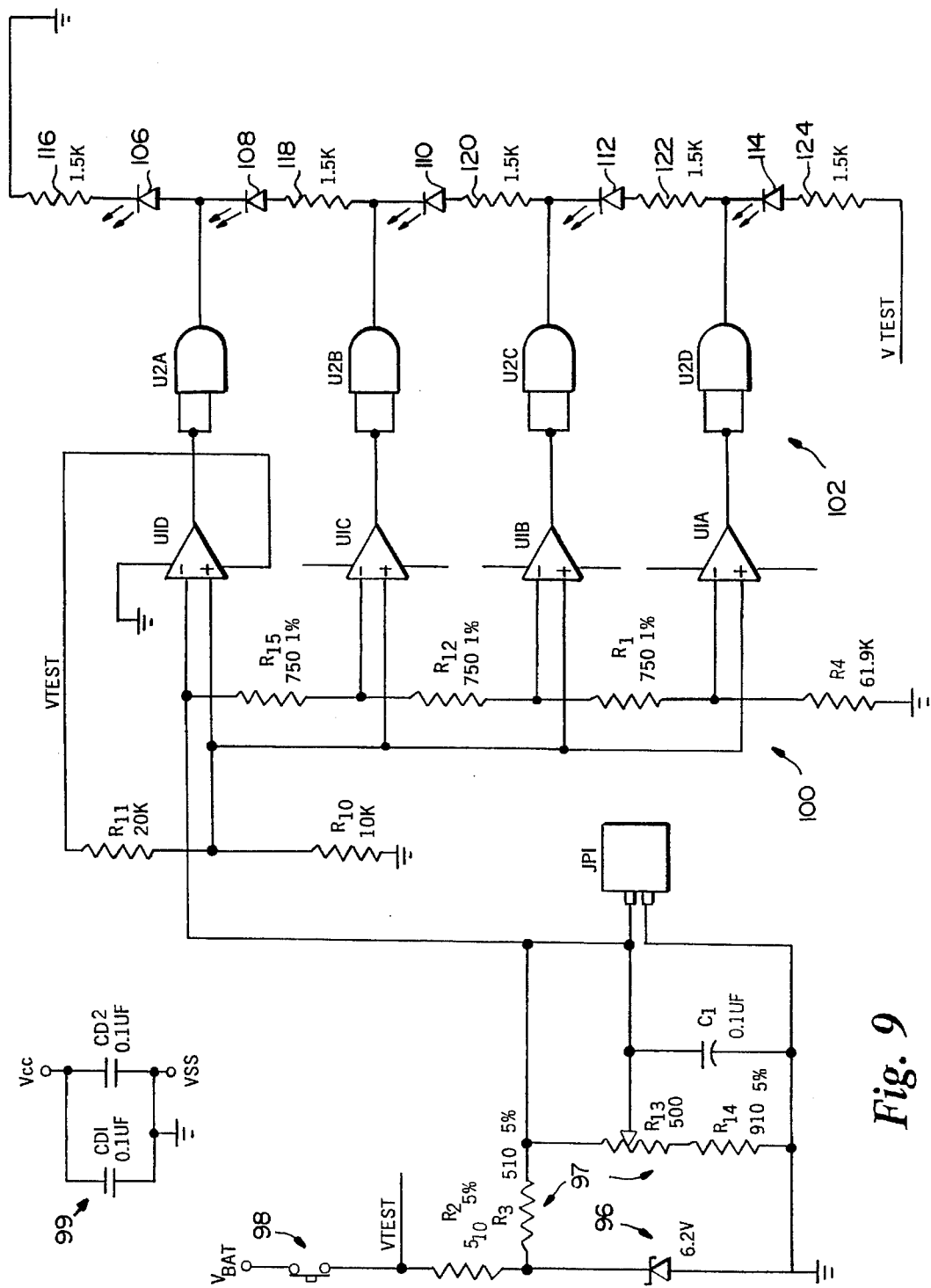
FIG. 9 is a circuit diagram which may be utilized in connection with the state-of-charge indicator assembly of this invention.

Using the LM 324A and CD4081B microprocessors 100, 102, and given the arrangement of components on the board 54, a suitable circuit for implementing the objective of the invention is illustrated in FIG. 9. The circuit design per se, however, is not critical to the invention here.

With reference to FIG. 9, and in the 2-chip arrangement illustrated, a reference voltage is developed by the Zener Diode 96 and associated resistor network 97 ($R_2$, $R_3$, $R_{13}$, $R_{14}$). Power to chips 100, 102 is supplied by a capacitor input filter 99 including capacitors $CD_1$ and $CD_2$. The reference voltage is applied to the top of a voltage divider with each of four Op-Amps of chip 100 picking off its reference voltage at a suitable point, as an inverting input (resistors 104 in FIG. 5 and including $R_{15}$, $R_{12}$, $R_1$, $R_4$ in FIG. 9). The battery voltage is applied to the non-inverting input of each Op-Amp through a 3–1 voltage divider ($R_{11}$, $R_{10}$). If the battery voltage as applied to each input is greater than the reference voltage, the Op-Amp output goes high and triggers the AND gate ON. With all gates ON, only LED 106 (100% charge) will light since it is the only one connected to ground (V BATT-). As the voltage drops below each reference voltage in turn, that particular Op-Amp output goes low and causes the AND gate to do likewise. The AND gate that goes low will cause the appropriate LED to light by providing a sink to ground. None of the other LED's will light because there is no voltage across them. In the exemplary embodiment, LED 106 (100%) will light at voltages of 12.65 and above; LED 108 (75%) will light at voltages of between 12.50 and 12.65; LED 110 (50%) will light at voltages between 12.35 and 12.5; LED 112 (25%) will light at voltages of between 12.25 and 12.35; and LED 114 (0%) will light at voltages below 12.25.

In use then, the user simply presses the button 98 through the seal or plaque 30 at the printed button 34. The appropriate percent charge LED display light will light up, clearly visible through the window 32 thus providing essential information to the user.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a battery cover including a body having a plurality of vent apertures, at least one negative terminal and at least one positive terminal, the improvement comprising a recess in the cover opening to a top surface thereof; a battery condition indicator assembly including at least one display light secured within said recess, and a thin seal adhered to said cover overlying said recess and sealing said indicator assembly therein, said indicator assembly activated through said film, and with said display light visible through said seal.

2. The improvement of claim 1 wherein said battery condition indicator assembly includes a plurality of indicator lights, and said seal includes a substantially transparent window overlying, said indicator lights.

3. The improvement of claim 2 wherein said battery condition indicator assembly comprises an elongated housing having an upper surface with a switch aperture and a plurality of indicator light apertures formed therein; and a circuit board assembly mounted in said housing and including a push button switch and said plurality of indicator lights thereon.

4. The improvement of claim 3 wherein said circuit board includes a pair of terminal wires attached to respective extensions of said negative and said positive terminals.

5. The improvement of claim 1 wherein said battery condition indicator is a state-of-charge indicator.

6. The improvement of claim 5 wherein said battery condition indicator displays state-of-charge, and has five indicator lights to indicate, incrementally, 0-25-50-75-100 percent charge.

7. A battery cover including a body having a top surface and a peripheral skirt; said top surface having a plurality of vent apertures, at least one negative terminal and at least one positive terminal, and an elongated recess having a bottom, four side walls and an open top; said negative and positive terminals having extensions exposed at opposite ends of said recess; a state-of-charge- indicator assembly mounted in said recess and electrically connected to said negative and positive terminals; said state-of-charge indicator assembly being sealed in said recess by a membrane applied over said open top and adhered to the top surface, said membrane having percent charge and test switch indicia thereon, and wherein said state-of-charge indicator is activated by pressure applied through said film.

8. The battery cover of claim 7 wherein said state-of-charge indicator assembly includes a plurality of display lights and a test button.

9. The battery cover of claim 7 wherein said state-of-charge indicator includes a circuit board mounting a Zener diode, a test switch, a pair of microprocessor chips, and a plurality of display lights and associated resistors.

10. The battery cover of claim 9 and further including terminal connection wires extending from opposite ends of the board and soldered to said terminal extensions.

11. The battery cover of claim 10 wherein said board is seated within a housing having a top wall and a peripheral side wall, said housing top wall having an aperture for receiving a button actuator of said test switch and a plurality of display apertures overlying said display lights.

12. The battery cover of claim 11 wherein said housing is ultrasonically fastened within said recess.

13. The battery cover of claim 11 wherein said top wall includes a pair of integrally hinged extensions at opposite ends thereof, overlying said terminal connection wires.

14. A storage battery including a casing and a cover secured to the casing, the cover including a body having a top surface and a peripheral skirt; said top surface having a plurality of vent apertures, at least one negative terminal and at least one positive terminal, and an elongated recess having a bottom, four side walls and an open top; said negative and positive terminals having extensions exposed at opposite ends of said recess; a battery condition indicator assembly mounted in said recess and electrically connected to said negative and positive terminals; said battery condition indicator assembly sealed in said recess by a membrane applied over said open top and adhered to said top surface.

15. The battery of claim 14 wherein said battery condition indicator assembly includes a plurality of indicator lights which displays battery state-of-charge in terms of percent.

16. The battery of claim 15 wherein said state-of-charge indicator assembly includes a test button.

17. The battery of claim 15 wherein said state-of-charge indicator includes a circuit board mounting a Zener diode, a test switch, a pair of microprocessor chips, and a plurality of display lights and associated resistors.

18. The battery of claim 17 and further including terminal connection wires extending from opposite ends of the board and soldered to said terminal extensions.

19. The battery of claim 17 wherein said board is seated within a housing having a top wall and a peripheral side wall, said housing top wall having an aperture for receiving a button actuator of said test switch and a plurality of display apertures overlying said display lights; and wherein said housing is ultrasonically fastened within said recess.

20. A battery cover having an elongated recess therein, said recess having an open upper end; a battery condition indicator assembly mounted in said elongated recess and including a button switch actuator; and a thin adhesive seal covering said recess and adhered to said, such that said button switch is activated by applying force through said seal.

* * * * *